(12) United States Patent
Kirita et al.

(10) Patent No.: US 8,395,151 B2
(45) Date of Patent: Mar. 12, 2013

(54) METHOD OF MANUFACTURING THIN FILM TRANSISTOR, THIN FILM TRANSISTOR, AND DISPLAY UNIT

(75) Inventors: Shina Kirita, Tokyo (JP); Toshitaka Kawashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/422,825

(22) Filed: Mar. 16, 2012

(65) Prior Publication Data

US 2012/0175611 A1 Jul. 12, 2012

Related U.S. Application Data

(62) Division of application No. 12/635,099, filed on Dec. 10, 2009, now Pat. No. 8,163,592.

(30) Foreign Application Priority Data

Dec. 24, 2008 (JP) .................... 2008-327332

(51) Int. Cl.
*H01L 29/786* (2006.01)

(52) U.S. Cl. .................... 257/43; 257/E29.296

(58) Field of Classification Search .............. 257/432, 257/440, E21.128, E31.057, 43, E29.296
See application file for complete search history.

(56) References Cited

U.S. PATENT DOCUMENTS

| 7,737,517 B2 * | 6/2010 | Kawamura et al. ........... 257/432 |
| 2010/0155717 A1 | 6/2010 | Yano et al. |
| 2011/0031494 A1 | 2/2011 | Fujii et al. |

FOREIGN PATENT DOCUMENTS

| JP | 2005-268724 | 9/2005 |
| JP | 2007-073697 | 3/2007 |
| JP | 2007-073699 | 3/2007 |
| JP | 2007-250983 | 9/2007 |

* cited by examiner

*Primary Examiner* — Roy Potter
(74) *Attorney, Agent, or Firm* — SNR Denton US LLP

(57) ABSTRACT

A thin film transistor having (a) an oxide semiconductor film including a channel region composed of an oxide semiconductor, and a source electrode region and a drain electrode region that are composed of the same oxide semiconductor as that of the channel region and have a higher carrier density than that of the channel region; (b) a gate insulating film; and (c) a gate electrode.

2 Claims, 9 Drawing Sheets

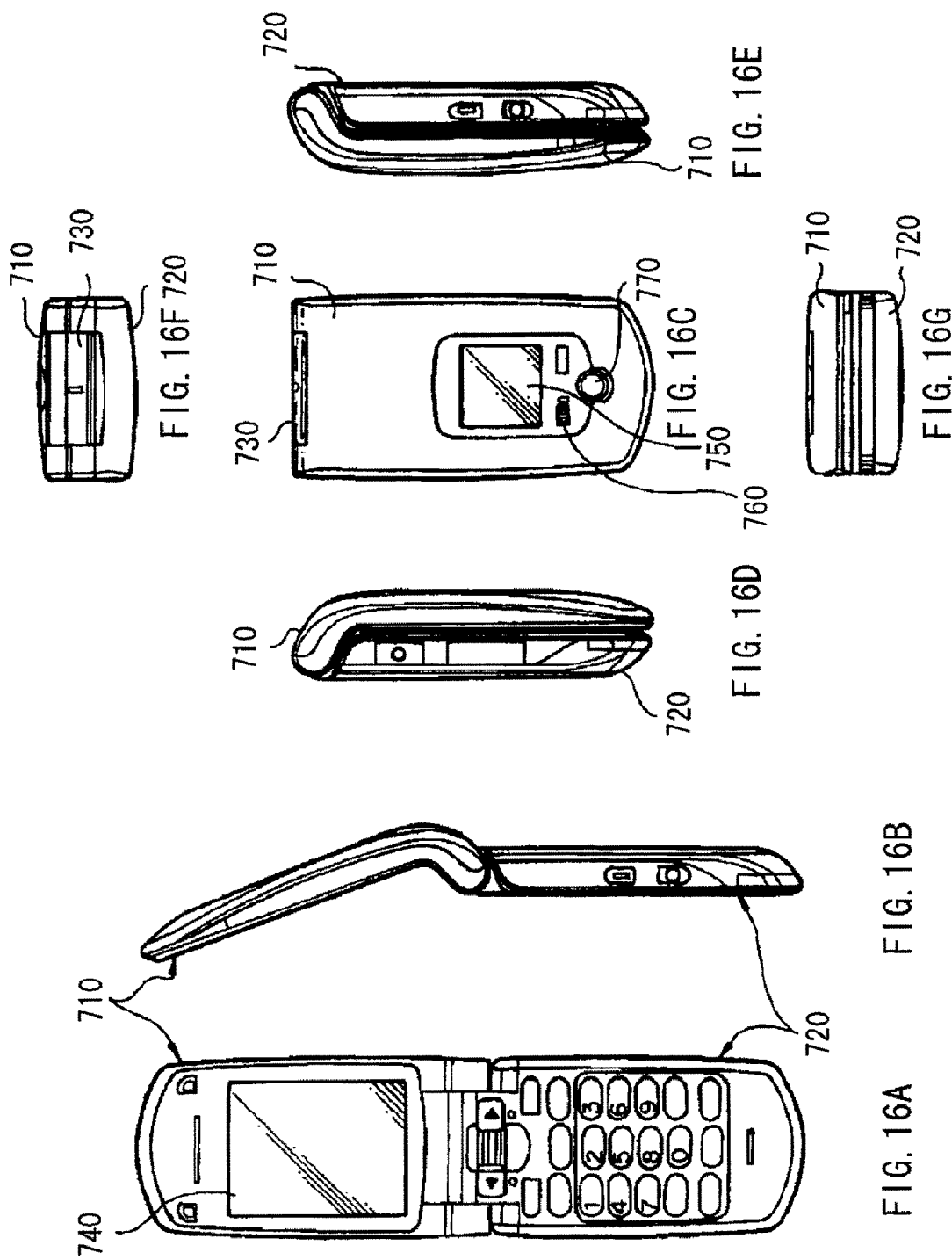

METHOD OF MANUFACTURING THIN FILM TRANSISTOR, THIN FILM TRANSISTOR, AND DISPLAY UNIT

RELATED APPLICATION DATA

This application is a division of U.S. patent application Ser. No. 12/635,099, filed Dec. 10, 2009, the entirety of which is incorporated herein by reference to the extent permitted by law. The present application claims the benefit of priority to Japanese Patent Application No. JP 2008-327332 filed in the Japanese Patent Office on Dec. 24, 2008, the entirety of which is incorporated by reference herein to the extent permitted by law.

BACKGROUND OF THE INVENTION

1. Field of the Invention

The present invention relates to a method of manufacturing a thin film transistor (TFT) including an oxide semiconductor, a thin film transistor, and a display unit including the same.

2. Description of the Related Art

In the past, a semiconductor represented by silicon (Si) has been used for a channel layer of a thin film transistor, and the carrier density has been controlled by ion implantation of a donor, an acceptor and the like. Further, in recent years, as a semiconductor that has a larger electron mobility than that of silicon and has superior electric characteristics, a semiconductor having a metal oxide such as zinc oxide (ZnO) as a main component (hereinafter referred to as an oxide semiconductor) has attracted attention. It has been studied to apply the oxide semiconductor to the channel layer of the thin film transistor (for example, refer to Japanese Unexamined Patent Application Publication No. 2007-73697).

SUMMARY OF THE INVENTION

In the existing thin film transistor as in Japanese Unexamined Patent Application Publication No. 2007-73697, however, it has been necessary to form and pattern the gate electrode, the gate insulating film, the channel layer composed of the oxide semiconductor, and the source/drain electrode in the respective steps individually.

In view of the foregoing disadvantage, in the invention, it is desirable to provide a method of manufacturing a thin film transistor capable of simplifying the steps, a thin film transistor capable of being manufactured with a simple step, and a display unit including the same.

According to an embodiment of the invention, there is provided a method of manufacturing a thin film transistor including the following steps A to D:
A: forming a gate electrode and a gate insulating film sequentially on a substrate;
B: forming an oxide semiconductor film in a shape including a planned channel formation region, a planned source electrode formation region, and a planned drain electrode formation region on the gate insulating film so that the whole oxide semiconductor film has the same carrier density as a carrier density of the planned channel formation region;
C: forming a mask inhibiting heat transmission on the planned channel formation region; and
D: heating the oxide semiconductor film in the air and thereby obtaining a higher carrier density of a region of the oxide semiconductor film not covered with the mask than the carrier density of the planned channel formation region.

According to an embodiment of the invention, there is provided a thin film transistor including the following elements A to C:
A: an oxide semiconductor film including a channel region composed of an oxide semiconductor, and a source electrode region and a drain electrode region that are composed of the same oxide semiconductor as that of the channel region and have a higher carrier density than that of the channel region;
B: a gate insulating film; and
C: a gate electrode.

According to an embodiment of the invention, there is provided a display unit including a thin film transistor and a pixel. The thin film transistor is composed of the thin film transistor in the foregoing embodiment of the invention.

In the method of manufacturing a thin film transistor according to the embodiment of the invention, first, the gate electrode and the gate insulating film are sequentially formed on the substrate. Next, the oxide semiconductor film in the shape including the planned channel formation region, the planned source electrode formation region, and the planned drain electrode formation region is formed on the gate insulating film. At this time, the oxide semiconductor film is formed so that the whole oxide semiconductor film has the same carrier density as the carrier density of the planned channel formation region. Subsequently, the mask inhibiting heat transmission is formed on the planned channel formation region. After that, the oxide semiconductor film is heated in the air. At this time, the mask inhibits heat transmission to the planned channel formation region, which becomes the channel region with the carrier density before heating maintained. Meanwhile, in a region of the oxide semiconductor film not covered with the mask, oxygen defect or the like is generated by heating, the carrier density is increased, and the resistance value is lowered.

In result, the region of the oxide semiconductor film not covered with the mask becomes the source electrode region and the drain electrode region.

In the thin film transistor according to the embodiment of the invention, the oxide semiconductor film includes the channel region, the source electrode region, and the drain electrode region that are composed of the same oxide semiconductor. The carrier density of the source electrode region and the drain electrode region is higher than that of the channel region. Thus, while manufacturing is enabled with the simple steps, the source electrode region and the drain electrode region are able to have a sufficient function as an electrode.

In the display unit according to the embodiment of the invention, the pixel is driven by the thin film transistor according to the embodiment of the invention, and an image is displayed.

According to the method of manufacturing a thin film transistor of the embodiment of the invention, the oxide semiconductor film in the shape including the planned channel formation region, the planned source electrode formation region, and the planned drain electrode formation region is formed so that the whole oxide semiconductor film has the same carrier density as the carrier density of the planned channel formation region. After the mask inhibiting heat transmission is formed on the planned channel formation region, the oxide semiconductor film is heated in the air and thereby the carrier density of the region of the oxide semiconductor film not covered with the mask is set higher than the carrier density of the planned channel formation region. Thus, the channel region, the source electrode region, and the drain electrode region are able to be formed in the oxide semiconductor film with the simple steps.

According to the thin film transistor of the embodiment of the invention or the display unit of the embodiment of the invention, the oxide semiconductor film includes the channel region composed of the oxide semiconductor, and the source electrode region and the drain electrode region that are composed of the same oxide semiconductor as that of the channel region and have the higher carrier density than that of the channel region. Thus, the thin film transistor is able to be manufactured with the simple steps.

Other and further objects, features and advantages of the invention will appear more fully from the following description.

BRIEF DESCRIPTION OF THE DRAWINGS

FIG. 16A is an elevation view of a sixth application example unclosed, FIG. 16B is a side view thereof, FIG. 16C is an elevation view of the sixth application example closed, FIG. 16D is a left side view thereof, FIG. 16E is a right side view thereof, FIG. 16F is a top view thereof, and FIG. 16G is a bottom view thereof.

DETAILED DESCRIPTION OF THE PREFERRED EMBODIMENT

An embodiment of the invention will be hereinafter described in detail with reference to the drawings. The description will be given in the following order:

1. Thin Film Transistor
2. Application examples

Thin Film Transistor

Figure 1:
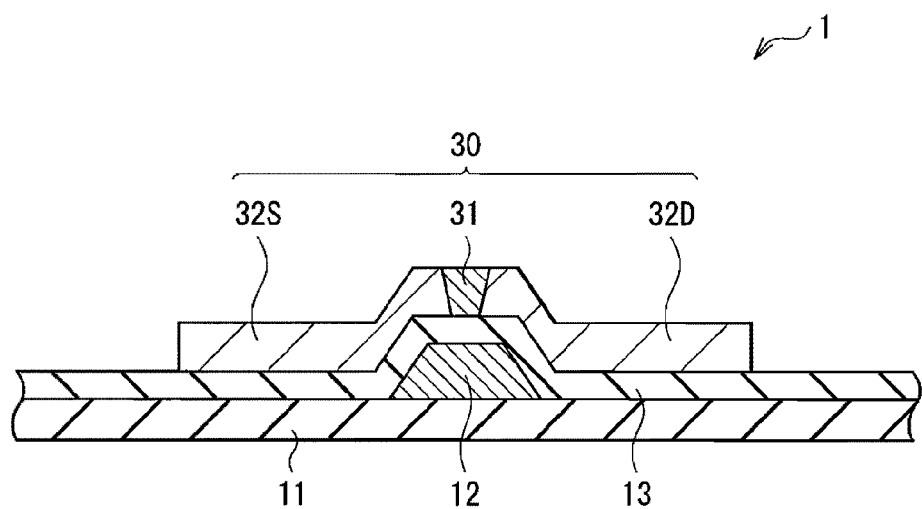
FIG. 1 is a cross sectional view illustrating a structure of a thin film transistor according to an embodiment of the invention.

FIG. 1 illustrates a cross sectional structure of a thin film transistor 1 according to an embodiment of the invention. The thin film transistor 1 functions as a drive element for, for example, a liquid crystal display and an organic EL (Electro Luminescence) display, and has, for example, a bottom gate structure (inversely staggered structure).

The thin film transistor 1 has a gate electrode 12 in a selective region on a substrate 11. On the gate electrode 12, an oxide semiconductor film 30 is formed with a gate insulating film 13 in between. The oxide semiconductor film 30 includes a channel region 31, a source electrode region 32S, and a drain electrode region 32D.

The substrate 11 is made of a glass substrate, a plastic film or the like. Examples of plastic materials include PET (polyethylene terephthalate) and PEN (polyethylene naphthalate). Since the oxide semiconductor film 30 is formed without heating the substrate 11 in sputtering method described later, an inexpensive plastic film is able to be used.

The gate electrode 12 is an electrode to apply a gate voltage to the thin film transistor 1. The gate electrode 12 is made of a transparent conducting film composed of, for example, ITO (indium tin oxide), AZO (aluminum doped zinc oxide), and GZO gallium doped zinc oxide). The thickness of the gate electrode 12 is, for example, from 50 nm to 200 nm both inclusive.

The gate insulating film 13 is made of a silicon oxide film, a silicon nitride film, a silicon nitrided oxide film or the like. The thickness of the gate insulating film 13 is, for example, from 50 nm to 200 nm both inclusive.

The oxide semiconductor film 30 includes the channel region 31, the source electrode region 32S, and the drain electrode region 32D. The channel region 31 is composed of a transparent oxide semiconductor having zinc oxide as a main component such as AZO doped with aluminum and GZO doped with gallium. The source electrode region 32S and the drain electrode region 32D are composed of the same oxide semiconductor as that of the channel region 31 such as AZO and GZO, and has a carrier density different from that of the channel region 31. Thereby, in the thin film transistor 1, it is not necessary to form the channel layer in a step different from that of the source electrode and the drain electrode, and thus manufacturing is enabled with the use of simple steps.

Specifically, the carrier density of the source electrode region 32S and the drain electrode region 32D is, for example, preferably $1.0*10^{19}/cm^3$ or more and less than $1.0*10^{21}/cm^3$, and the carrier density of the channel region 31 is, for example, preferably $1.0*10^{13}/cm^3$ or more and less than $1.0*10^{18}/cm^3$. The thickness of the oxide semiconductor film 30 is, for example, from 20 nm to 200 nm both inclusive.

The thin film transistor 1 is able to be manufactured, for example, as follows.

Figure 2:
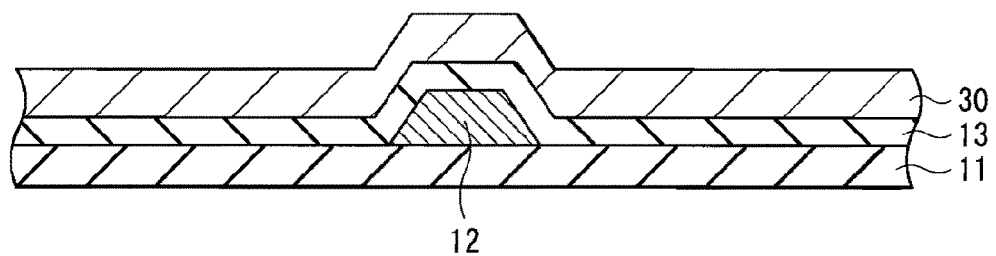
FIG. 2 is a cross sectional view illustrating a method of manufacturing the thin film transistor illustrated in FIG. 1 in the order of steps.

That is, first, a transparent conducting film as a material of the gate electrode 12 is formed on the whole area of the substrate 11 by using, for example, sputtering method and evaporation method. Next, as illustrated in FIG. 2, the transparent conducting film formed on the substrate 11 is patterned by using, for example, photolithography method to form the gate electrode 12.

Subsequently, as illustrated in FIG. 2 again, the gate insulating film 13 made of the foregoing material is formed on the substrate 11 to cover the gate electrode 12 by using, for example, sputtering method.

Figure 3:
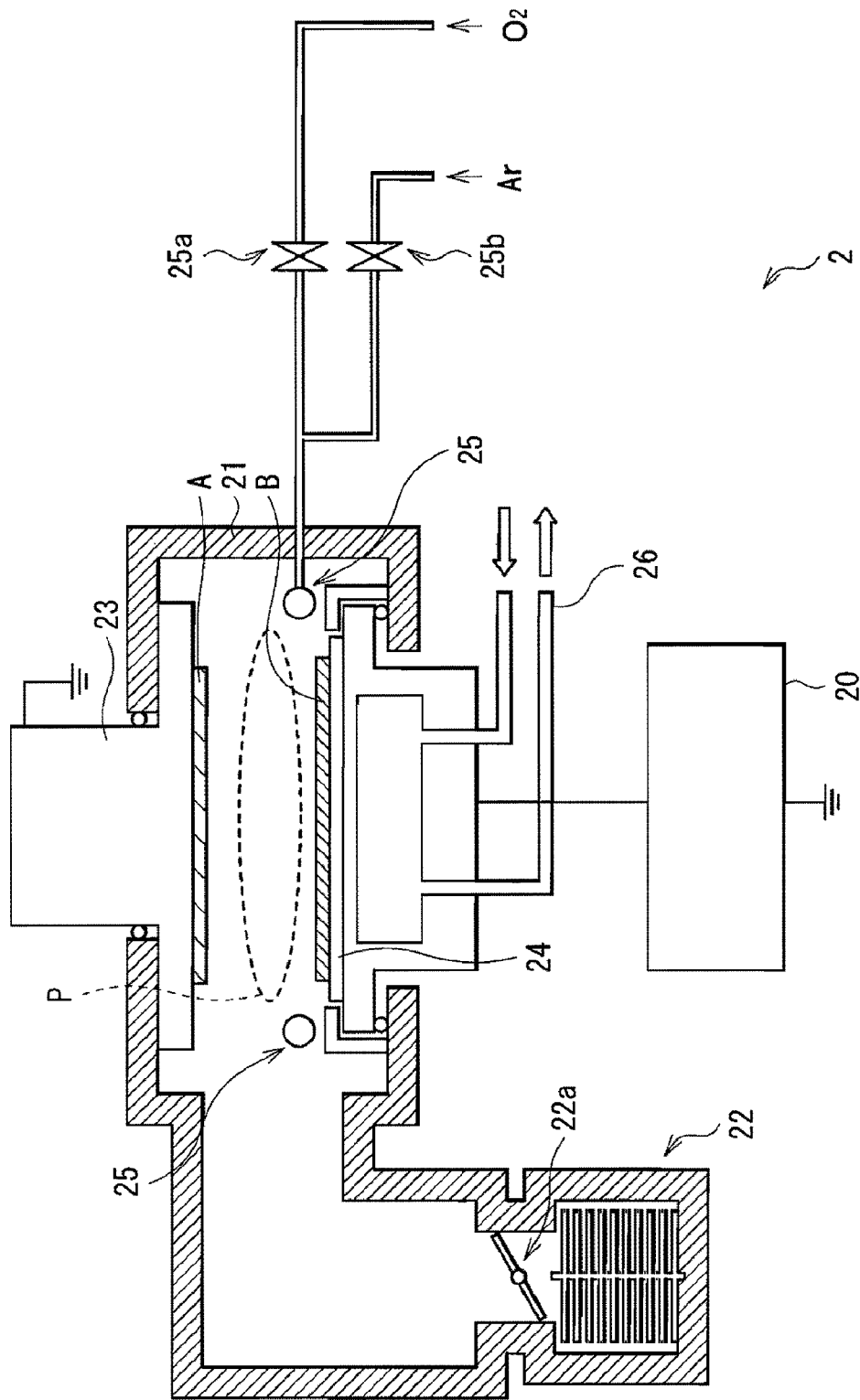
FIG. 3 is a schematic view illustrating a schematic structure of a DC sputtering equipment used in forming the oxide semiconductor film illustrated in FIG. 1.

After that, as illustrated in FIG. 2 again, the oxide semiconductor film 30 that is made of the foregoing material and that has the foregoing thickness is formed on the gate insulating film 13 so that the whole oxide semiconductor film 30 has the same carrier density as the carrier density of a planned channel formation region 31A. The oxide semiconductor film 30 is preferably formed by using, for example, sputtering method. As the sputtering method, DC (direct current) sputtering method is desirable. At this time, for example, a DC sputtering equipment 2 as illustrated in FIG. 3 is able to be used.

The DC sputtering equipment 2 is a DC magnetron sputtering equipment including a power source 20, a vacuum chamber 21, an exhaust pump 22, a substrate holder 23, a target mounting table 24, and a control unit (not illustrated) for performing drive control thereof In the DC sputtering equipment 2, a substrate A as a deposition object is able to be mounted on the substrate holder 23, and a target B as a deposition material is able to be mounted on the target mounting table 24 so that the substrate A and the target B are opposed to each other.

The power source 20 is a direct current power source that outputs a direct voltage Vdc. In the vacuum chamber 21, a gas inlet 25 for introducing reactive gas and sputtering gas into the chamber is provided. In this case, oxygen gas as reactive gas and argon gas as sputtering gas are respectively used. The gas inlet 25 is connected to an oxygen gas supply source and an argon gas supply source (not illustrated) through an $O_2$ gas flow rate controller 25a and an Ar gas flow rate controller 25b. Such oxygen gas and such argon gas are introduced into the vacuum chamber 21 as mixed gas. The exhaust pump 22 exhausts air in the vacuum chamber 21 in cooperation with a gate valve 22a. Below the target mounting table 24, a cooling pipe 26 for recycling cathode cooling water, a magnet (not illustrated) and the like are arranged.

In forming the oxide semiconductor film 30 by using such a DC sputtering equipment 2, first, the substrate A and the target B are mounted on the foregoing positions. At this time, the substrate 11 on which the gate electrode 12 and the gate insulating film 13 are formed is used as the substrate A, and an AZO fired substance obtained by doping zinc oxide with 2 wt % of alumina ($Al_2O_3$) is used as the target B. Subsequently, inside of the vacuum chamber 21 is exhausted until the vacuum degree becomes, for example, $1.0*10^{-4}$ Pa or less. After that, the mixed gas of oxygen and argon is introduced into the vacuum chamber 21. At this time, the ratio of oxygen gas in the DC sputtering equipment 2 is, for example, about 1.0% to 5.0% both inclusive, and such a ratio is kept constant in forming the film by using, for example, MFC (Mass Flow Controller).

Figure 4:
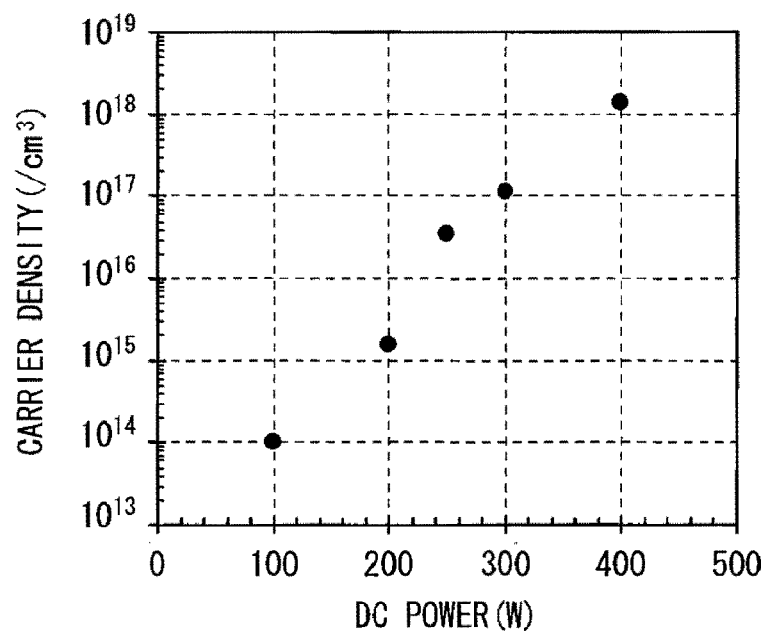
FIG. 4 is a characteristics diagram illustrating a relation between a DC power and a carrier density.

Next, the direct voltage Vdc is applied between the substrate A and the target B. At this time, the DC power (electric power) is preferably set according to a desired carrier density D. For example, to obtain the same carrier density of the whole oxide semiconductor film 30 as the carrier density of the planned channel formation region 31A, the DC power is set according to the carrier density of the planned channel formation region 31A. There is an interrelation between the DC power and the carrier density D, and such a relation shows lineality (proportional relation). FIG. 4 illustrates an example thereof. Specifically, to obtain the carrier density D from $1.0*10^{13}/cm^3$ to $1.0*10^{18}/cm^3$ both inclusive, the DC power is selected in the range from 50 W to 500 W both inclusive according to the value of the carrier density D. For example, to obtain the carrier density D suitable for the channel region 31 or the panned channel formation region 31A ($1.0*10^{16}/cm^3$), the DC power is set to about 250 W.

Meanwhile, in the past, a technique for controlling the carrier density by adjusting the flow rate (partial pressure) of oxygen gas in sputtering method has been used. In the technique, interrelation between the carrier density and the oxygen partial pressure is used. However, the interrelation between the carrier density and the oxygen partial pressure generally shows a curved line, and has no lineality. In this embodiment, the carrier density D is able to be more easily controlled than in the past by using the proportional relation between the DC power and the carrier density D.

Further, in the case where the carrier density is controlled by oxygen partial pressure as in the past, the oxygen flow rate should be adjusted by using the MFC. Thus, the control result is subject to precision of the MFC. Meanwhile, in this embodiment, since the carrier density D is controlled by adjusting the DC power, the control result is hardly subject to precision of devices other than the sputtering equipment. Accordingly, process reproducibility is able to be improved.

Being applied with the voltage, plasma discharge P is generated between the substrate A and the target B. Due to the plasma discharge P, particles of the target B are flicked and adhered onto the surface of the substrate A, that is, the surface of the gate insulating film 13 on the substrate 11. Thereby, the oxide semiconductor film 30 composed of AZO is formed.

Figure 5:
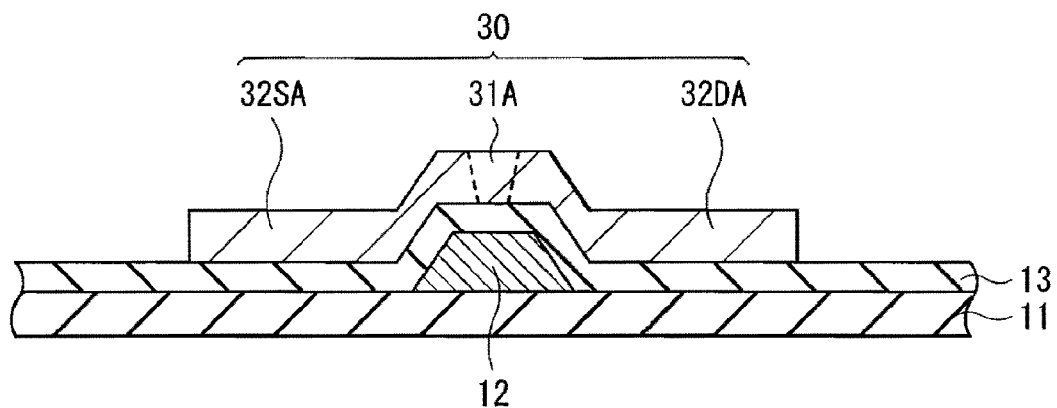
FIG. 5 is a cross sectional view illustrating a step following FIG. 2.

After that, as illustrated in FIG. 5, the formed oxide semiconductor film 30 is patterned into a shape including a planned channel formation region 31A, a planned source electrode formation region 32SA, and a planned drain electrode formation region 32DA by using, for example, photolithography method.

Figure 6:
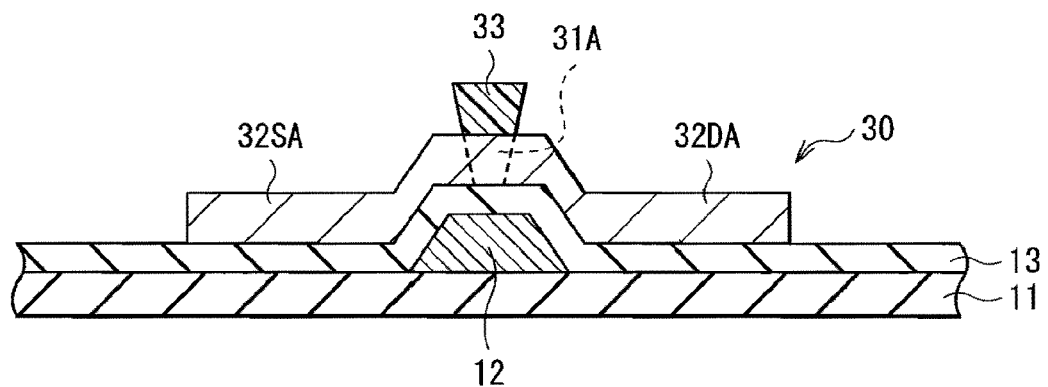
FIG. 6 is a cross sectional view illustrating a step following FIG. 5.

After patterning the oxide semiconductor film 30, as illustrated in FIG. 6, a mask 33 is formed on the planned channel formation region 31A of the oxide semiconductor film 30. The mask 33 is intended to inhibit heat transmission to the planned channel formation region 31A in a heating step described later. As the mask 33, a material having high heat resistance and having superior workability is desirably used. Specifically, the mask 33 is preferably made of, for example, a photoresist, since the photoresist is able to be easily patterned, resulting in the simple step thereof. The mask 33 may be formed by print processes. Further, the mask 33 may be formed by forming an insulating film by vacuum deposition such as sputtering, vacuum evaporation, and CVD, forming a photoresist film on the insulating film, and patterning the insulating film by photolithography with the use of the photoresist film.

Figure 7:
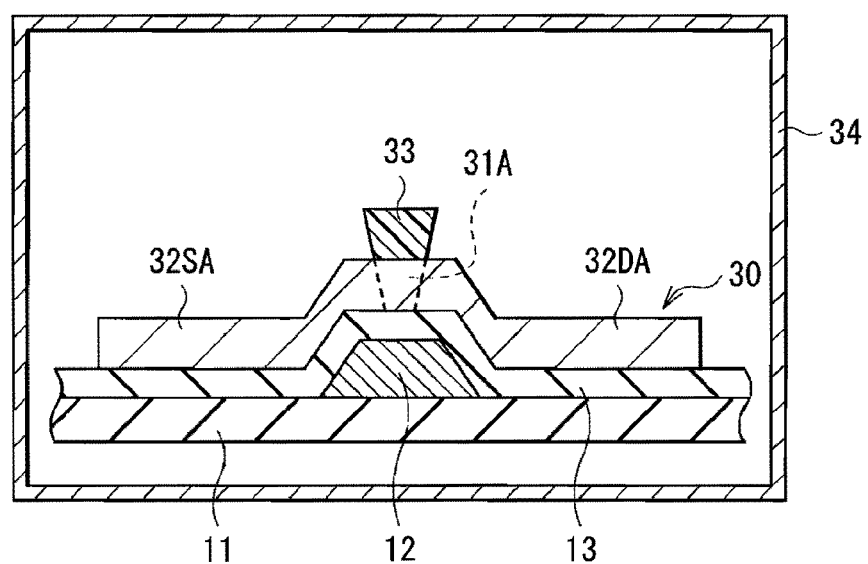
FIG. 7 is a cross sectional view illustrating a step following FIG. 6.
Figure 8:
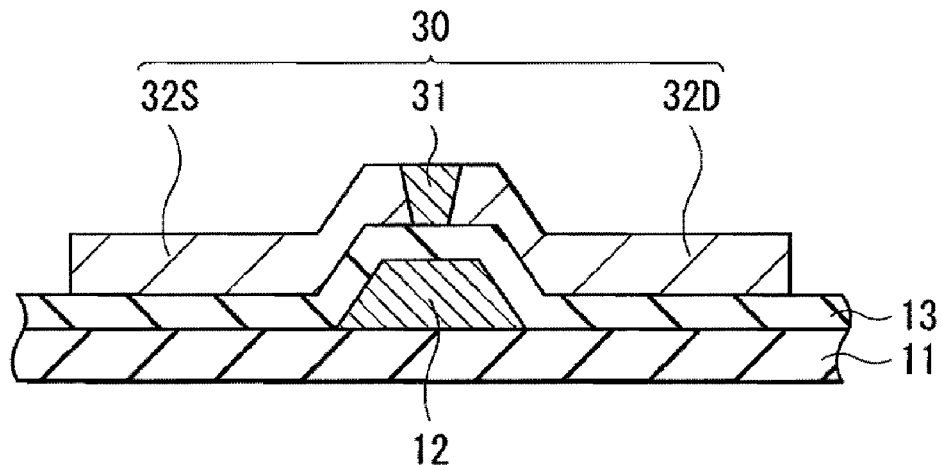
FIG. 8 is a cross sectional view illustrating a step following FIG. 7.

After the mask 33 is formed, as illustrated in FIG. 7, the substrate 11 on which the gate electrode 12, the gate insulating film 13, and the oxide semiconductor film 30 are formed is set in a furnace 34, and heated in the air. The heating temperature is preferably, for example, from 100 deg C. to 200 deg C. both inclusive. At this time, the mask 33 inhibits heat transmission to the planned channel formation region 31A, which becomes the channel region 31 with the carrier density before heating maintained as illustrated in FIG. 8. Meanwhile, in a region of the oxide semiconductor film 30 not covered with the mask 33, that is, the planned source electrode formation region 32SA and the planned drain electrode formation region 32DA, oxygen defect or the like is generated by heating, the carrier density is increased, and the resistance value is lowered. In result, the planned source electrode formation region 32SA and the planned drain electrode formation region 32DA become the source electrode region 32S and the drain electrode region 32D.

Figure 9:
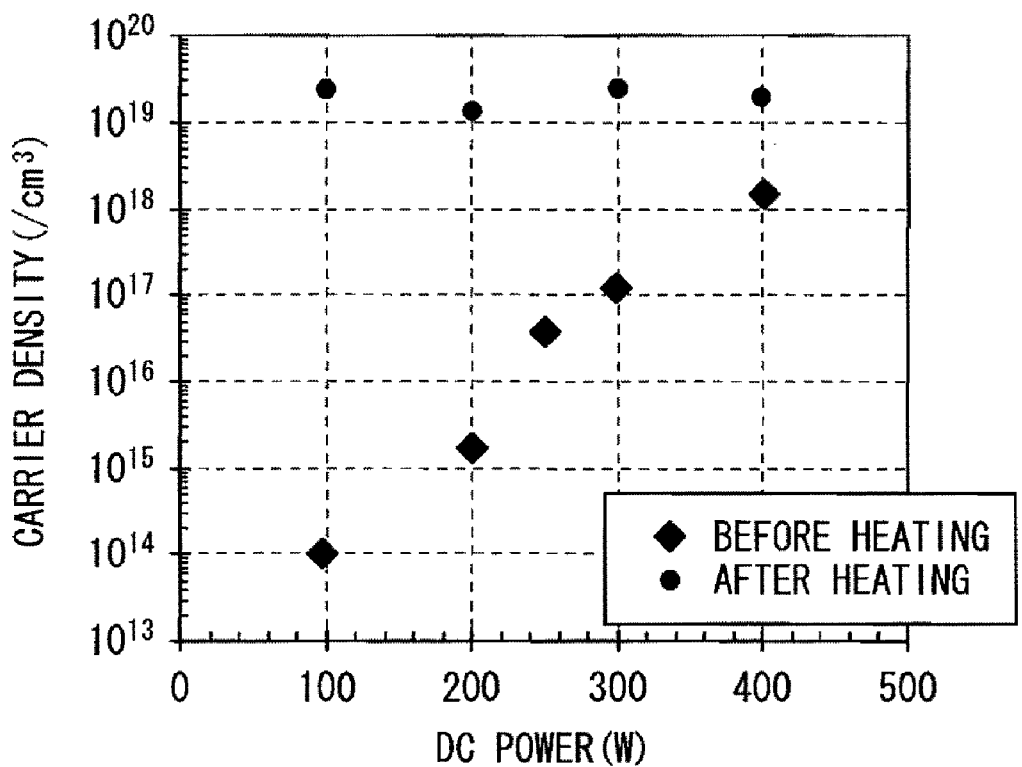
FIG. 9 illustrates change from a carrier density before heating to a carrier density after heating at 100 deg C. in a region of the oxide semiconductor film not covered with a mask.

FIG. 9 illustrates change from the carrier density before heating to the carrier density after heating at 100 deg C. in the region of the oxide semiconductor film 30 not covered with the mask 33. As evidenced by FIG. 9, before heating, the interrelation between the DC power and the carrier density D shows lineality (proportional relation). Meanwhile, after heating at 100 deg C., the carrier density D shows a high value of $1.0*10^{19}/cm^3$ or more without relation to DC power values.

Specifically, it is preferable that by performing the step of heating the oxide semiconductor film 30 in the air, the carrier density in the region of the oxide semiconductor film 30 not covered with the mask 33 is set to, for example, from $1.0*10^{19}/cm^3$ or more and less than $1.0*10^{21}/cm^3$, and the carrier density in the planned channel formation region 31A (that is, the channel region 31) is set to, for example, $1.0*10^{13}/cm^3$ or more and less than $1.0*10^{18}/cm^3$.

After that, the substrate 11 is taken out from the furnace 34, and the mask 33 is removed as illustrated in FIG. 8 again. The mask 33 is not necessarily removed, but may be left. Accordingly, the thin film transistor 1 illustrated in FIG. 1 is completed.

In the thin film transistor 1, when a voltage (gate voltage) of a given threshold value voltage or more is applied to the gate electrode 12 through a wiring layer (not illustrated), a current (drain current) is generated in the channel region 31 between the source electrode region 32S and the drain electrode region 32D.

As described above, in this embodiment, the oxide semiconductor film 30 in the shape including the planned channel formation region 31A, the planned source electrode formation region 32SA, and the planned drain electrode formation region 32DA is formed so that the whole oxide semiconductor film 30 has the same carrier density as the carrier density of the planned channel formation region 31A. In addition, the mask 33 inhibiting heat transmission is formed on the planned channel formation region 31A and then the oxide semiconductor film 30 is heated in the air, and thereby the carrier density in the region of the oxide semiconductor film 30 not covered with the mask 33 is set higher than the carrier density of the planned channel formation region 31A. Thus, necessity to form the channel layer and the source/drain electrode in the respective steps individually is eliminated, and the channel region 31, the source electrode region 32S, and the drain electrode region 32D are able to be formed in the oxide semiconductor film 30 with the simple steps. Accordingly, the thin film transistor 1 is able to be manufactured with simple steps. Further, time to newly develop the material and the manufacturing process of the source electrode and the drain electrode is able to be saved.

FIRST APPLICATION EXAMPLE

Figure 10:
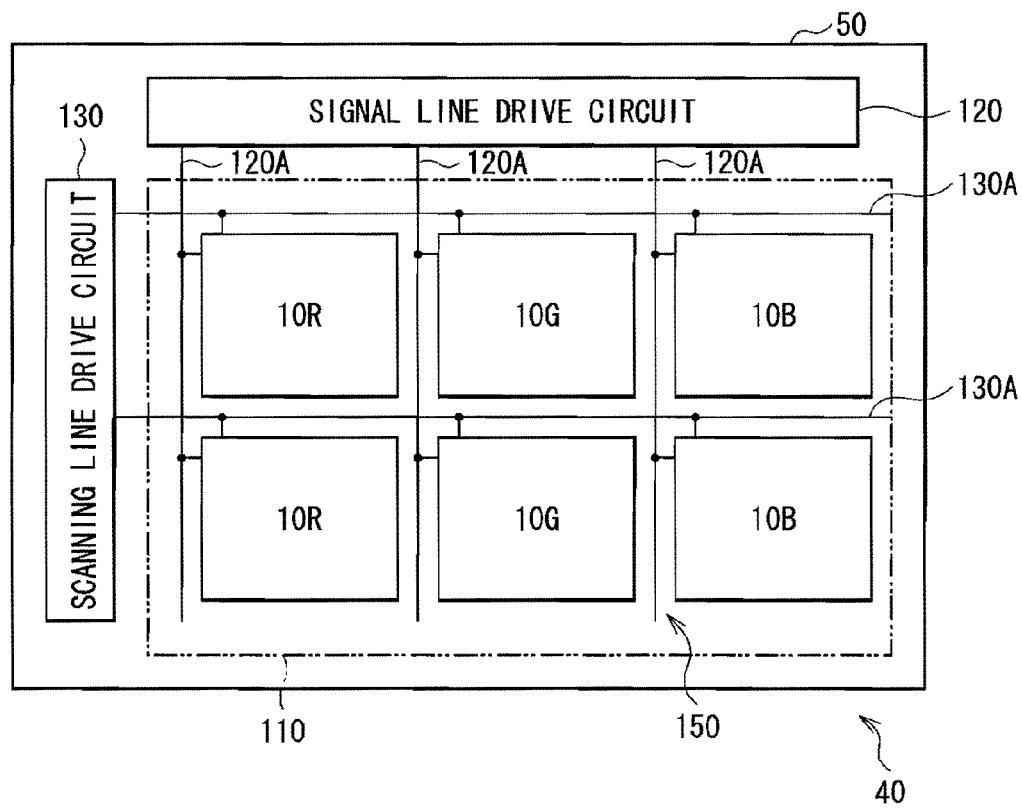
FIG. 10 is a diagram illustrating a circuit structure of a display unit according to a first application example.

FIG. 10 illustrates a circuit structure of a display unit including the thin film transistor 1 as a drive element. A display unit 40 is, for example, a liquid crystal display, an organic EL display or the like. In the display unit 40, a plurality of pixels 10R, 10G, and 10B arranged in a state of matrix and various drive circuits for driving the pixels 10R, 10G, and 10B are formed on a drive panel 50. The pixels 10R, 10G, and 10B are respectively a liquid crystal display device, an organic EL device or the like that emits color light of red (R: red), green (G: green), or blue (B: blue). One pixel combination is composed of the three pixels 10R, 10G, and 10B, and a plurality of pixel combinations structure a display region 110. On the drive panel 50, as a drive circuit, a signal line drive circuit 120 and a scanning line drive circuit 130 as a driver for displaying a video and a pixel drive circuit 150 are arranged. A sealing panel (not illustrated) is bonded to the drive panel 50. The pixels 10R, 10G, and 10B and the foregoing drive circuits are sealed by the sealing panel.

Figure 11:
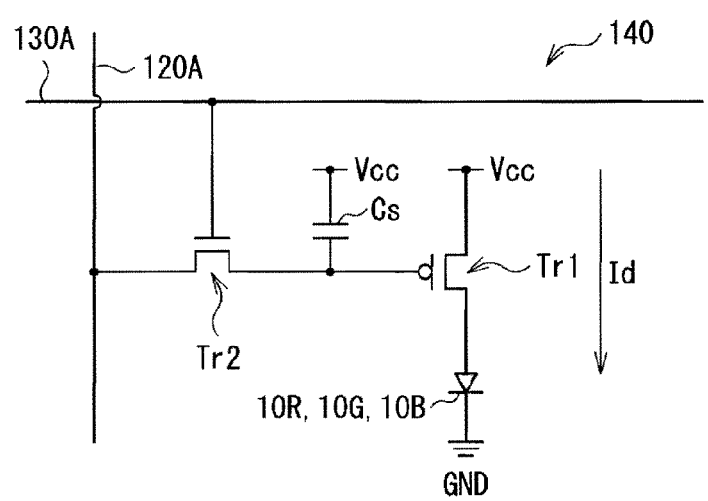
FIG. 11 is an equivalent circuit diagram illustrating an example of the pixel drive circuit illustrated in FIG. 10.

FIG. 11 is an equivalent circuit diagram of the pixel drive circuit 150. The pixel drive circuit 150 is an active drive circuit in which transistors Tr1 and Tr2 as the foregoing thin film transistor 1 are arranged. A capacitor Cs is provided between the transistors Tr1 and Tr2. The pixel 10R (or the pixel 10G/10B) is connected to the transistor Tr1 in series between a first power source line (Vcc) and a second power source line (GND). In such a pixel drive circuit 150, a plurality of signal lines 120A are arranged in the column direction, and a plurality of scanning lines 130A are arranged in the row direction. Each signal line 120A is connected to the signal line drive circuit 120. A video signal Sig is supplied from the signal line drive circuit 120 to a source electrode of the transistor Tr2 through the signal line 120A. Each scanning line 130A is connected to the scanning line drive circuit 130. A scanning signal is sequentially supplied from the scanning line drive circuit 130 to a gate electrode of the transistor Tr2 through the scanning line 130A. Such a display unit 40 is able to be mounted on, for example, electron devices of second to sixth application examples described below.

SECOND APPLICATION EXAMPLE

Figure 12:
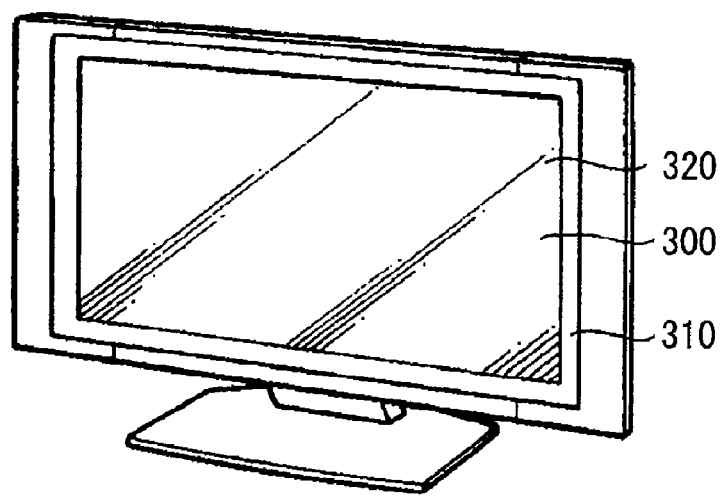
FIG. 12 is a perspective view illustrating an appearance of a second application example.

FIG. 12 illustrates an appearance of a television device. The television device has, for example, a video display screen section 300 including a front panel 310 and a filter glass 320.

THIRD APPLICATION EXAMPLE

Figure 13A:
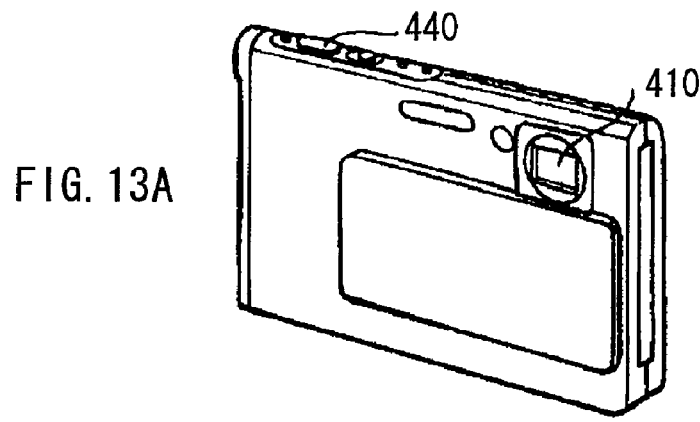
FIG. 13A is a perspective view illustrating an appearance viewed from the front side of a third application example.
Figure 13B:
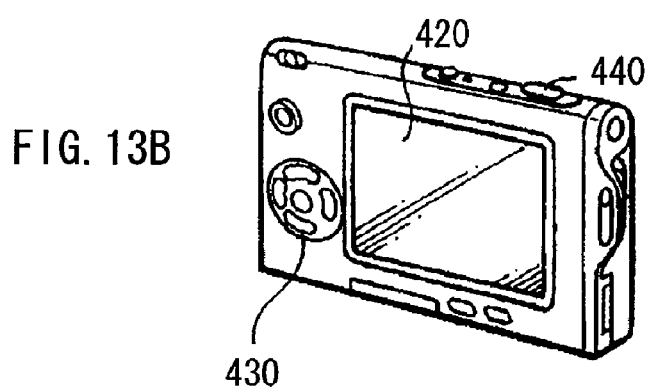
FIG. 13B is a perspective view illustrating an appearance viewed from the rear side of the third application example.

FIGS. 13A and 13B illustrate an appearance of a digital still camera. The digital still camera has, for example, a light emitting section for a flash 410, a display section 420, a menu switch 430, and a shutter button 440.

FOURTH APPLICATION EXAMPLE

Figure 14:
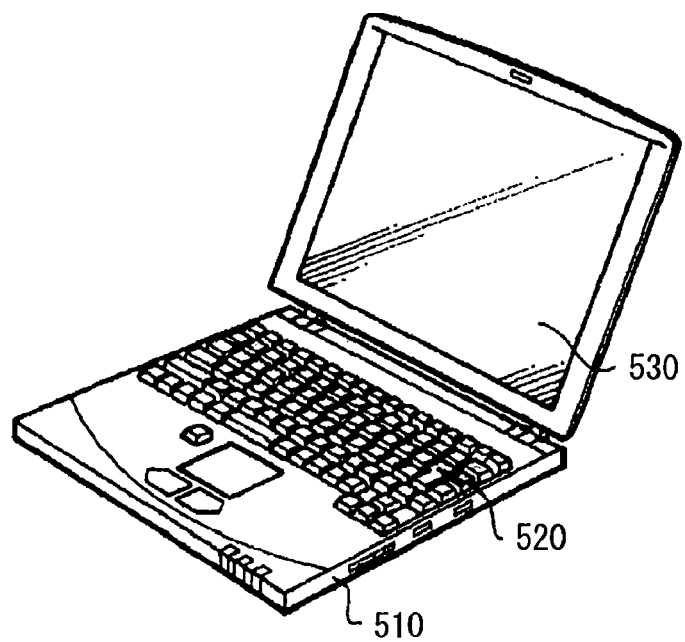
FIG. 14 is a perspective view illustrating an appearance of a fourth application example.

FIG. 14 illustrates an appearance of a notebook personal computer. The notebook personal computer has, for example, a main body 510, a keyboard 520 for operation of inputting characters and the like, and a display section 530 for displaying an image.

FIFTH APPLICATION EXAMPLE

Figure 15:
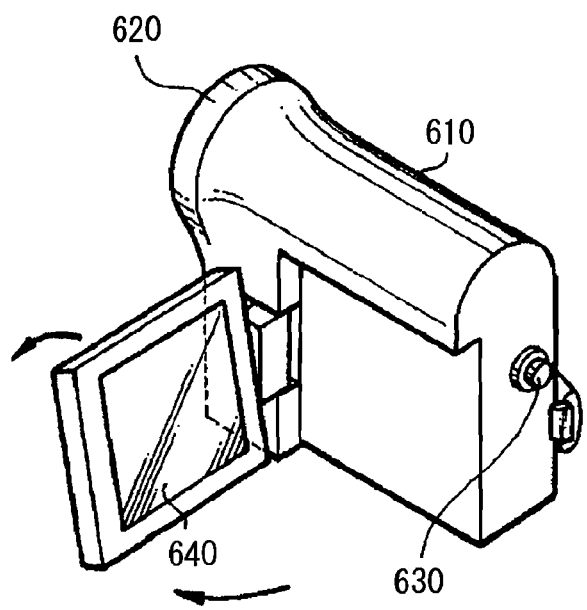
FIG. 15 is a perspective view illustrating an appearance of a fifth application example.

FIG. 15 illustrates an appearance of a video camera. The video camera has, for example, a main body 610, a lens for capturing an object 620 provided on the front side face of the main body 610, a start/stop switch in capturing 630, and a display section 640.

SIXTH APPLICATION EXAMPLE

FIGS. 16A to 16G illustrate an appearance of a mobile phone. In the mobile phone, for example, an upper package 710 and a lower package 720 are jointed by a joint section (hinge section) 730. The mobile phone has a display 740, a sub-display 750, a picture light 760, and a camera 770.

While the invention has been described with reference to the embodiment, the invention is not limited to the foregoing embodiment, and various modifications may be made. For example, in the foregoing embodiment, as the thin film transistor, the bottom gate structure is described as an example. However, the structure is not limited thereto, and the thin film transistor may have a top gate structure.

Further, for example, the material, the thickness, the film-forming method, the film-forming conditions and the like of each layer are not limited to those described in the foregoing embodiment, but other material, other thickness, other film-forming method, and other film-forming conditions may be adopted.

In addition, the invention is able to be applied to a display unit including other display device such as an inorganic electroluminescence device, an electrodeposition display device, and an electrochromic display device in addition to the liquid crystal display and the organic EL display.

It should be understood by those skilled in the art that various modifications, combinations, sub combinations and alternations may occur depending on design requirements and other factors insofar as they are within the scope of the appended claims or the equivalents thereof.

What is claimed is:

1. A thin film transistor comprising:
an oxide semiconductor film including (a) a source electrode region, (b) a drain electrode region and (c) a channel region between the source electrode and drain electrode regions;
a gate insulating film; and
a gate electrode,
wherein,
each of the source electrode region and the drain electrode region has a carrier density that is higher than that of the channel region, and
the carrier density of the channel region is from $1.0*10^{13}/cm^3$ to $1.0*10^{18}/cm^3$ inclusive.

2. A display unit comprising:
a thin film transistor; and
a pixel,
wherein,
the thin film transistor comprises an oxide semiconductor film,
the oxide semiconductor film including a (a) a source electrode region (b) a drain electrode region, and (c) a channel region between the source electrode and drain electrode regions,
each of the source electrode region and the drain electrode region has a carrier density that is higher than that of the channel region, and
the carrier density of the channel region is from $1.0*10^{13}/cm^3$ to $1.0*10^{18}/cm^3$ inclusive.

* * * * *